(12) United States Patent
Isoda

(10) Patent No.: US 7,755,411 B2
(45) Date of Patent: Jul. 13, 2010

(54) DC CURRENT REDUCTION CIRCUIT

(75) Inventor: Naoki Isoda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/391,235

(22) Filed: Feb. 23, 2009

(65) Prior Publication Data

US 2009/0212840 A1    Aug. 27, 2009

(30) Foreign Application Priority Data

Feb. 27, 2008    (JP) .............................. 2008-046891

(51) Int. Cl.
*H03L 5/00*    (2006.01)
(52) U.S. Cl. ............................ 327/307; 327/558; 330/9
(58) Field of Classification Search ................. 327/307, 327/558; 330/9
See application file for complete search history.

(56) References Cited

U.S. PATENT DOCUMENTS 3,978,399 A * 8/1976 Chadbourne ................ 324/225

6,429,733 B1 * 8/2002 Pagliolo et al. ............. 327/552

FOREIGN PATENT DOCUMENTS

JP     2005-286664 A    10/2005

* cited by examiner

*Primary Examiner*—Kenneth B. Wells
(74) *Attorney, Agent, or Firm*—Fitzpatrick, Cella, Harper & Scinto

(57) ABSTRACT

A DC current reduction circuit of the present invention that reduces a DC component in an output current of a current output element in which an AC current and a DC current are superimposed includes a low-pass filter for extracting a current component of a frequency lower than a cutoff frequency from the output current and a reduction unit that reduces the extracted current component from the output current. The low-pass filter has a frequency changing unit that changes the cutoff frequency from higher to lower as a continuous function over time.

7 Claims, 3 Drawing Sheets

DC CURRENT REDUCTION CIRCUIT

BACKGROUND OF THE INVENTION

1. Field of the Invention

The present invention relates to a DC current reduction circuit, and more particularly, to a DC current reduction circuit that reduces the DC component from a current output from a current output element such as a photodiode, in which an AC current and a DC current are superimposed.

2. Description of the Related Art

Current that is output from a current output element such as a photodiode includes direct (DC) current and alternating (AC) current. At the same time, for most applications only AC current is required. In such cases, because the DC current degrades the dynamic range of an active circuit connected subsequent to the current output element, it is necessary to reduce the DC current.

With regard to this problem, in the conventional art there is a method that uses a high-pass filter to transmit only the AC component to the subsequent active circuit and a method that uses a low-pass filter to extract the DC component from the original signal and uses the extracted DC component to cancel the DC component of the original signal.

However, the above-described conventional art has the problems described below. That is, almost all the filters used in the conventional art are constructed using fixed resistors and fixed capacitors, and therefore their cutoff frequency is fixed. Consequently, there is a trade-off between tracking ability of a circuit to track abrupt changes in the DC component that occur suddenly and attenuation loss of the AC component to be sent to the subsequent active circuit. In addition, in a case in which the resistors and the capacitors of the filter are formed within an integrated circuit formed on a semiconductor substrate, in terms of chip and package costs there are restrictions on the lower limit of the cutoff frequency, which leads to limitations on applications.

By contrast, in an invention described in Japanese Patent Laid-Open No. 2005-286664, high-resistance channels of MOS transistors operating under subthreshold characteristics (hereinafter MOS resistors) are used as the above-described resistors to achieve an enhancement of the lower limit on the cutoff frequency within a limited chip surface area. In addition, in the event that there is an abrupt displacement in the DC component above a prescribed voltage, the MOS resistors operate linearly and cause the cutoff frequency to increase temporarily, quickly clamping the voltage displacement.

However, in the configuration described in Japanese Patent Laid-Open No. 2005-286664, in a case in which the abruptly displaced voltage of the DC component does not attain the prescribed size, the MOS resistors do not operate linearly and the DC level cannot be clamped quickly. Moreover, the ability to quickly clamp with the linear operation of the MOS resistors is limited to voltages in excess of the prescribed value, such that, with respect to residual DC components below the prescribed displacement, the DC level cannot be clamped quickly.

SUMMARY OF THE INVENTION

The present invention has been made in consideration of the above situation, and has as its object to be able to carry out clamping quickly regardless of the level of a DC component in a circuit that reduces the DC component from a current in which an AC component and the DC component are superimposed, without increasing the cost of the chip or package.

According to the present invention, the foregoing object is attained by providing a DC current reduction circuit that reduces a DC component in an output current of a current output element in which an AC current and a DC current are superimposed, comprising: a low-pass filter that extracts a current component of a frequency lower than a cutoff frequency from the output current; and a reduction unit that reduces the extracted current component from the output current, wherein the low-pass filter comprises a frequency changing unit that changes the cutoff frequency from higher to lower as a continuous function over time.

Further features of the present invention will become apparent from the following description of exemplary embodiments (with reference to the attached drawings).

DESCRIPTION OF THE EMBODIMENTS

Preferred embodiments of the present invention will be described in detail in accordance with the accompanying drawings.

Figure 1:
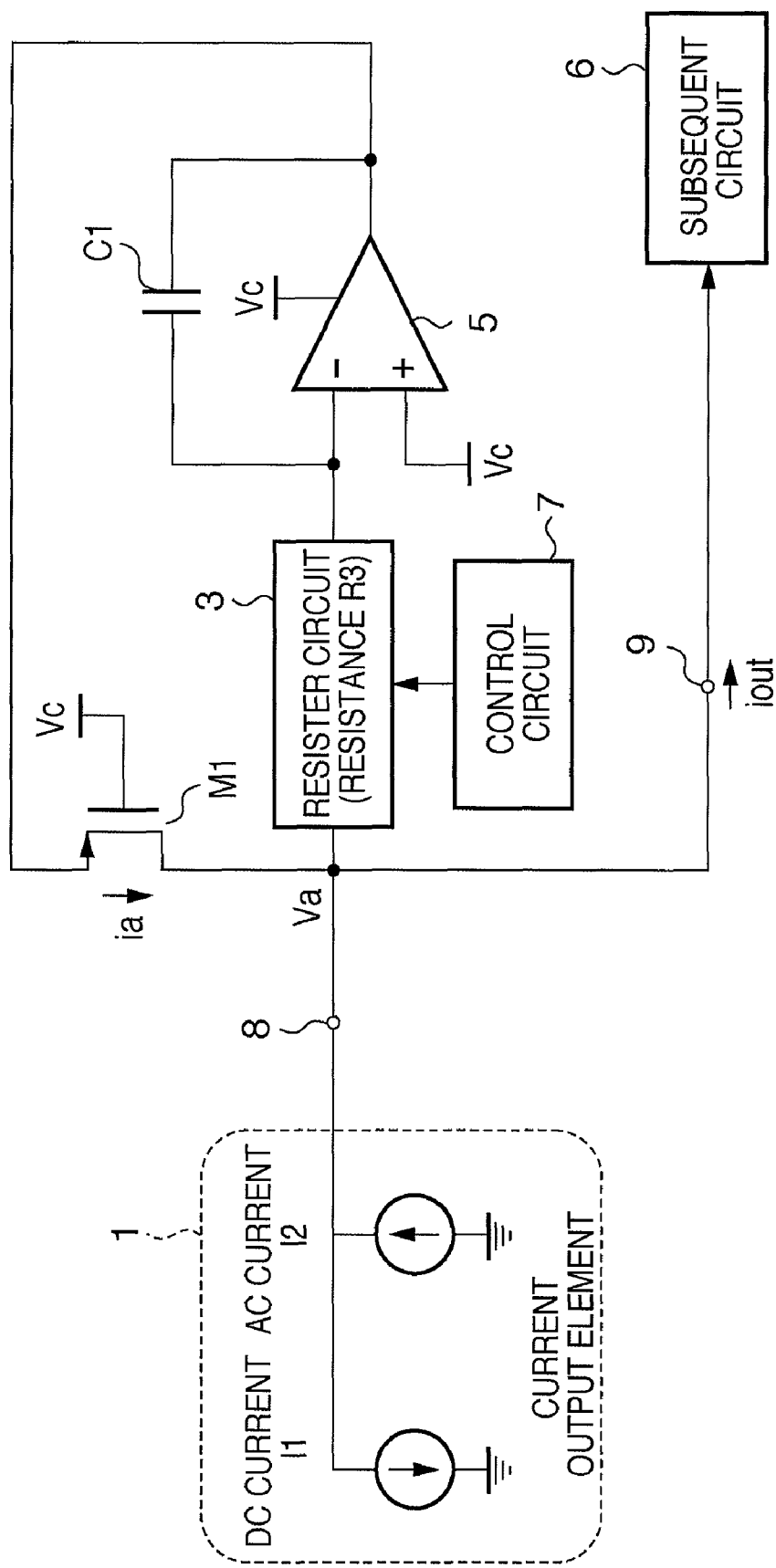
FIG. 1 is a circuit diagram illustrating a configuration of a current output element and a DC current reduction circuit according to an embodiment of the present invention.

FIG. 1 is a circuit diagram illustrating a configuration of a current output element and a DC current reduction circuit according to one embodiment of the present invention, in which all the elements shown in the drawing are formed within an integrated circuit (IC) formed on a semiconductor substrate. In addition, output currents I1, I2 of a current output element 1 represent a DC component and an AC component, respectively, of general current. The object of the present embodiment is to transmit to a subsequent circuit 6 only the current output element 1 AC component current I2.

The resistor circuit 3 shown in FIG. 1 uses a MOS transistor drain-source channel resistance. A condenser C1 shown in FIG. 1 is connected between an inverting input terminal and an output terminal of a high input impedance operation amplifier 5, and together with the resistor circuit 3 constitutes a low-pass filter. Then, from the output terminal of the operation amplifier 5, a voltage is output that corresponds to a current component of a frequency lower than a cutoff frequency that is determined by the capacitance of the condenser C1 and the resistance of the resistor circuit 3. A transistor M1 used with its gate grounded in FIG. 1 converts the output voltage of the operation amplifier 5 into M1 drain current ia. In other words, the transistor M1 operates as a voltage-current transducer (which is a current source), converting the output voltage of the operation amplifier 5 into current.

The present invention provides a clamp period for cutting the DC current, in which, at the start of the clamp period, a control circuit 7 shown in FIG. 1 decreases a resistance R3 of the resistor circuit 3. At this time, because a time constant determined by the capacitance of the condenser C1 and the resistance R3 shown in FIG. 1 is small, feedback composed of the resistor circuit 3, the operation amplifier 5, and the transistor M1 shown in FIG. 1 operates over a broad frequency band. Therefore, output resistance to the alternating current signal of the transistor M1 due to the feedback effect also decreases over a broad frequency band. Since this output resistance is ordinarily sufficiently small with respect to the input impedance of the subsequent circuit 6, most of the DC current I1 and the AC current I2 flows to the transistor M1, it can be approximated that ia≈I1−I2, and that an output current iout to the subsequent circuit 6 as iout≈0.

More specifically, in a region where the resistance R3 is small, when an electric potential Va changes, electric potential of the inverting input terminal of the operation amplifier 5 also quickly tracks the change in electric potential Va. As a result, a source electric potential of the transistor M1 that is connected to the output terminal of the operation amplifier 5 also tracks the change in electric potential Va, and a current that tracks a gate-source voltage Vgs that changes moment by moment flows through the transistor M1. Therefore, in the region where the resistance R3 is small, the current ia can be approximated to a current value that includes the AC component as I1−I2.

As time elapses in the clamp period, the control circuit 7 gradually increases the resistance R3 as a continuous function. As a result, the resistance R3 and the time constant of the capacitance of the condenser C1 increases. At this point, the feedback operation frequency band decreases as time elapses, and thus the frequency band in which the output resistance to the alternating current signal of the transistor M1 also decreases as time elapses.

More specifically, as the resistance R3 increases it becomes more difficult for changes in the electric potential Va (the AC component) to be transmitted to the inverting input terminal of the operation amplifier 5. As a result, the output of the operation amplifier 5 becomes unable to track the AC component, changes in the transistor M1 gate-source voltage Vgs become less frequent, and the AC component of the current ia becomes smaller. Then, the AC component extracted from the current ia flows to a terminal 9.

Thus, as described above, the AC current I2 is gradually diverted to the terminal 9 shown in FIG. 1, and the current ia gradually becomes I1 and iout gradually becomes I2.

At the moment when the clamp period ends, the control circuit 7 makes the resistance R3 substantially infinite. At this time, since the feedback operation does not work, the output resistance to the alternating current signal of the transistor M1 becomes sufficiently large with respect to the input impedance of the subsequent circuit 6, and ia and iout become ia≈I1 and iout≈I2. In addition, because the charge accumulated in the condenser C1 capacitance is maintained, the relation ia≈I1 is maintained.

As can be seen from the operation described above, it is possible to cut the DC current I1 of output element 1 so that only the AC current I2 is transmitted to the subsequent circuit 6, making it possible to reduce degradation of the dynamic range of the subsequent circuit 6. Further, the above-described operation does not depend on the level of the DC current I1. In addition, abrupt displacements in the DC current I1 are absorbed as the current ia from the transistor M1 at the beginning of the clamp period.

Figure 2:
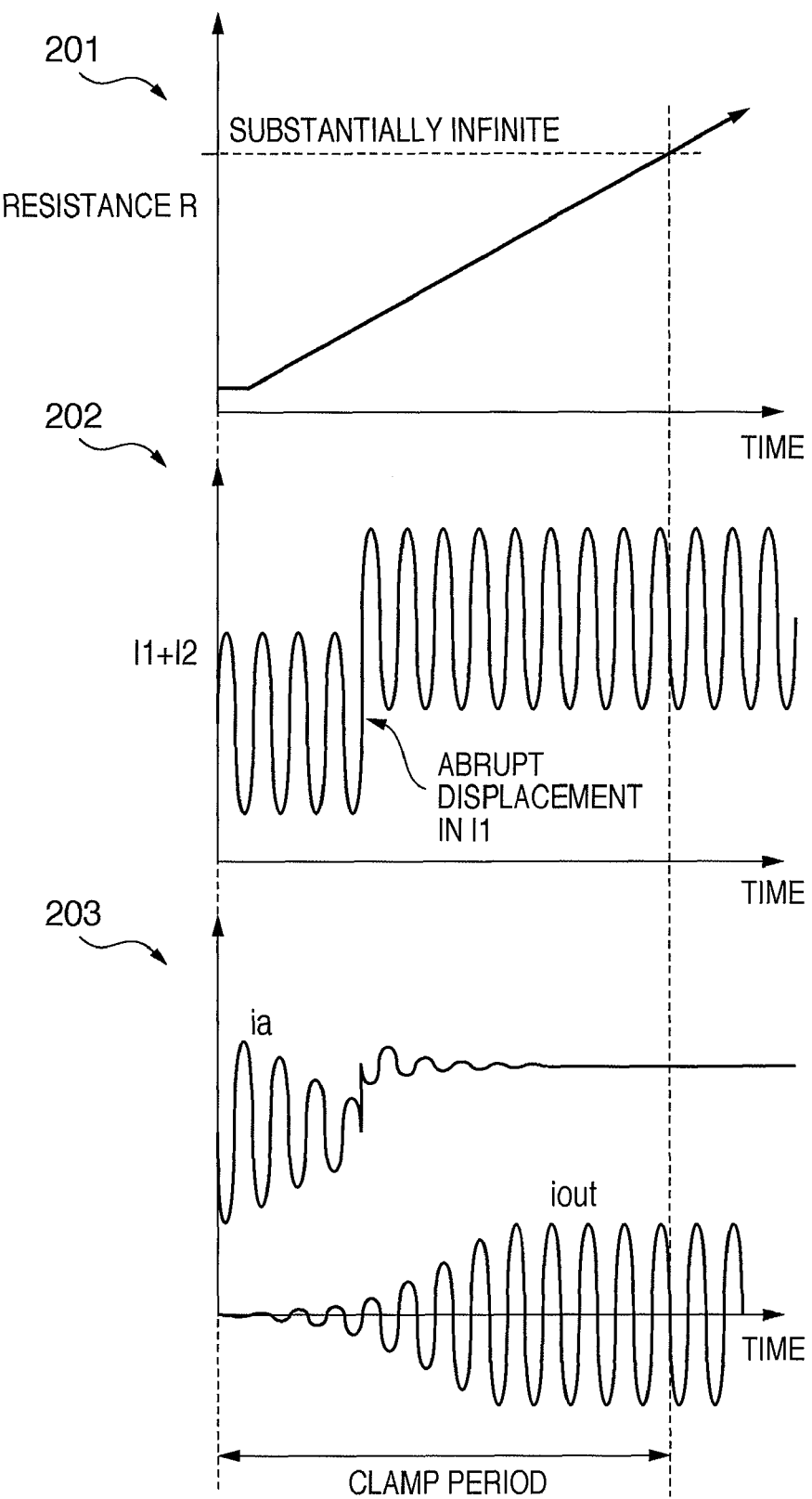
FIG. 2 is a signal waveform diagram schematically representing operation according to the embodiment of the present invention.

FIG. 2 schematically shows changes in resistance and current and voltage waveform of the parts shown in FIG. 1 in the operation described above, in a case where the DC current I1 changes abruptly. Reference numeral 201 denotes a graph showing change in resistance during the clamp period, 202 denotes a graph showing an example of output current from the current output element 1, and 203 denotes a graph illustrating an example of change in the current ia and iout that follow change in resistance. Even when the DC current I1 changes abruptly during the clamp period as shown by 202 the current ia quickly tracks the change, and thus the current iout gradually becomes a current that is equivalent to the AC current I2, from which the DC current I1 has been reduced.

Figure 3:
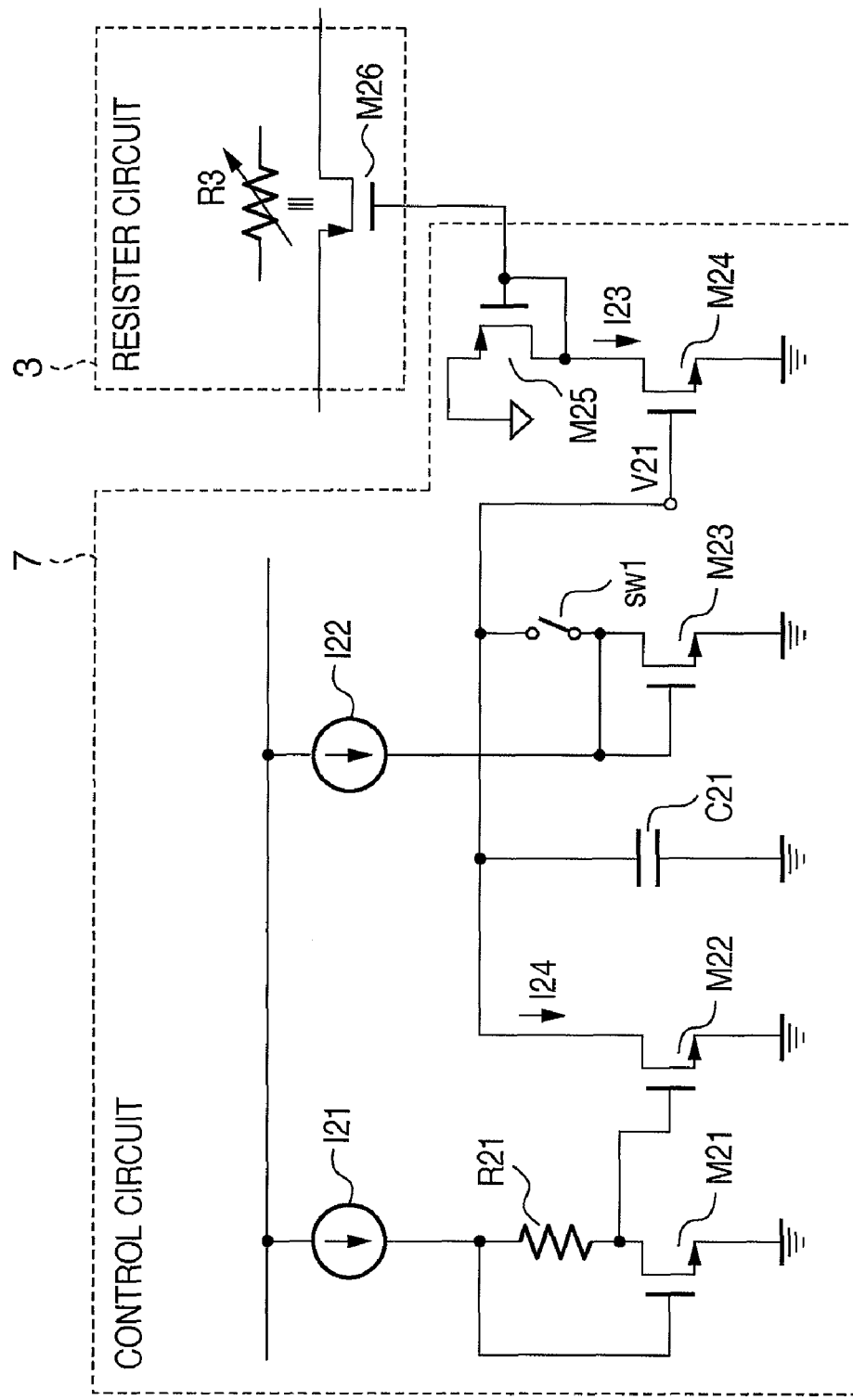
FIG. 3 is a circuit diagram of a control circuit according to the embodiment of the present invention.

Next, a general description is given of operation of the control circuit 7 using FIG. 3.

The resistance R3 of the resistor circuit 3 shown in FIG. 1 is realized by the drain-source channel resistance of MOS transistor M26 shown in FIG. 3. The resistance R3 is determined by the gate sizes of transistors M25, M26 shown in FIG. 3 and by the magnitude of a current I23 that flows through transistor M24, and, the larger the current I23, the lower the gate voltage of MOS transistor M26 and the smaller the channel resistance R3. The control circuit 7 gradually reduces the current I23 as the clamp period time elapses, essentially to zero at the point the clamp period ends. In other words, the gate voltage of the MOS transistor M26 of the resistor circuit 3 increases continuously as time elapses until the drain-source finally attains an essentially open state. With such control, the resistance R3 is increased as a continuous function as the clamp period elapses, enabling the cutoff frequency to be changed.

Below, a detailed description is given of the operation of the circuit shown in FIG. 3.

First, a switch sw1 is closed prior to the start of clamping, and a current from a current source I22 is amplified by a ratio between the gate sizes of the transistors M23 and M24 and the amplified current is copied as current I23. Here, a current source I21 and a resistance R21, and a size ratio between transistors M21 and M22, are designed so that a drain current I24 of the transistor M22 becomes sufficiently small with respect to a current from the current source I22. Since the current I23 continues to maintain a certain value prior to the start of clamping, the resistance R3 is small.

Switch sw1 is opened simultaneously with the start of clamping. From this time, the current I24 gradually discharges the charge held by condenser C21 and an electric potential V21 gradually decreases. As the electric potential V21 decreases, the current I23 can be gradually decreased, so that the resistance R3 gradually increases. Finally, the transistor M24 turns off, and the current I23 essentially becomes zero, and the resistance R3 essentially becomes infinite.

It should be noted that the value of the resistance R3 at the beginning of clamping can be easily adjusted by the magnitude of the current from the current source I22. In addition, during the clamp period, the speed with which the resistance R3 increases is controlled by the magnitude of the current I24 and the capacitance C21. In other words, the smaller the current I24, and the greater the capacitance C21, the slower the speed of increase in the resistance R3. Therefore, by appropriately selecting the current from the current source I22, the current I24, and the capacitance C21, adjustment of the clamp period in the present embodiment can be easily achieved.

By making the transistor M22 operate in a subthreshold region, the current I24 can be set to a very small value without increasing the surface area of the chip. Although there exists the disadvantage that MOS transistor subthreshold characteristics change greatly depending on ambient temperature, by using a current source with positive temperature characteristics for the current source I21, it is possible to suppress fluctuations in current from the current source I21 caused by temperature changes. Accordingly, sensitivity of the clamp period to temperature changes can be minimized.

Thus, as described above, the present embodiment can clamp quickly regardless of the level of a DC component in a circuit that reduces the DC component from a current in which an AC component and the DC component are superimposed. Further, the above-described effect can be obtained without increasing the cost of the chip or package even in a case where the DC current reduction circuit according to the present invention is formed on a semiconductor substrate.

Moreover, although changing the resistance R3 as a continuous function is described, alternatively this change may also be in the form of steps, provided that the size of the steps is very small, that is, small enough to be considered a continuous function.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-046891, filed on Feb. 27, 2008, which is hereby incorporated by reference herein its entirety.

What is claimed is:

1. A DC current reduction circuit that reduces a DC component in an output current of a current output element in which an AC current and a DC current are superimposed, comprising:
   a low-pass filter that extracts a current component of a frequency lower than a cutoff frequency from the output current; and
   a reduction unit that reduces the extracted current component from the output current,
   wherein the low-pass filter comprises a frequency changing unit that changes the cutoff frequency from higher to lower as a continuous function over time.

2. The DC current reduction circuit according to claim 1, wherein the frequency changing unit changes the cutoff frequency as a continuous function over time in a clamp period that clamps a current component to be reduced from the output current.

3. The DC current reduction circuit according to claim 1, wherein the low-pass filter comprises a condenser, a resistor circuit, and an operation amplifier, and the frequency changing unit changes the cutoff frequency by changing a time constant of the low-pass filter by changing a resistance of the resistor circuit as a continuous function over time.

4. The DC current reduction circuit according to claim 3, wherein the resistor circuit is configured using a MOS transistor channel and the frequency changing unit changes the cutoff frequency by continuously controlling a gate voltage of the MOS transistor over time.

5. The DC current reduction circuit according to claim 1, further comprising a current source that generates a current of a magnitude equivalent to the extracted current component,
   wherein the reduction unit decreases the DC component from the output current by subtracting a current generated by the current source from the output current.

6. The DC current reduction circuit according to claim 5, wherein the current source comprises a voltage-current transducer that converts an output voltage obtained by inputting an output voltage of the current output element to the low-pass filter into current.

7. The DC current reduction circuit according to claim 1, wherein the DC current reduction circuit is formed on a semiconductor substrate.

* * * * *